United States Patent
Heppenstall

(10) Patent No.: US 7,952,333 B2
(45) Date of Patent: May 31, 2011

(54) CIRCUIT AND METHOD FOR DETERMINING CURRENT IN A LOAD

(75) Inventor: Keith Heppenstall, Stockport (GB)

(73) Assignee: NXP B.V., Eindhoven (NL)

( * ) Notice: Subject to any disclaimer, the term of this patent is extended or adjusted under 35 U.S.C. 154(b) by 708 days.

(21) Appl. No.: 11/916,110

(22) PCT Filed: May 30, 2006

(86) PCT No.: PCT/IB2006/051721
§ 371 (c)(1),
(2), (4) Date: Apr. 22, 2008

(87) PCT Pub. No.: WO2006/129275
PCT Pub. Date: Dec. 7, 2006

(65) Prior Publication Data
US 2008/0191779 A1    Aug. 14, 2008

(30) Foreign Application Priority Data
Jun. 1, 2005   (EP) .................................... 05104755

(51) Int. Cl.
*G05F 1/40* (2006.01)

(52) U.S. Cl. ...................................................... 323/269

(58) Field of Classification Search ................... 323/268, 323/269, 271, 311, 312; 327/427
See application file for complete search history.

(56) References Cited

U.S. PATENT DOCUMENTS

| 5,815,027 | A   | 9/1998 | Tihanyi et al. |
| 7,009,403 | B2* | 3/2006 | Graf et al. ........................ 324/522 |
| 2004/0155662 | A1 | 8/2004 | Graf et al. |
| 2010/0156383 | A1* | 6/2010 | Mikami et al. ................. 323/312 |

FOREIGN PATENT DOCUMENTS

| CN | 85 1 02113 A | 1/1987 |
| EP | 0747713 A2 | 12/1996 |
| WO | 2004093320 A1 | 10/2004 |

* cited by examiner

*Primary Examiner* — Adolf Berhane

(57) ABSTRACT

A circuit (1) is described for determining the current ($I_{load}$) in a load (6), the circuit having a main transistor (2) and a sense transistor (3), each transistor having a main current path (4, 5) and a control terminal (9, 10), the main current paths each operably connected in parallel between the load and a ground terminal (7) and the control terminals being connected together. Means is provided for setting the voltage across the main current path (5) of the sense transistor (3) to a voltage level substantially equal to a predetermined portion of the voltage across the main current path (4) of the main transistor (3).

4 Claims, 1 Drawing Sheet

CIRCUIT AND METHOD FOR DETERMINING CURRENT IN A LOAD

Figure 1:
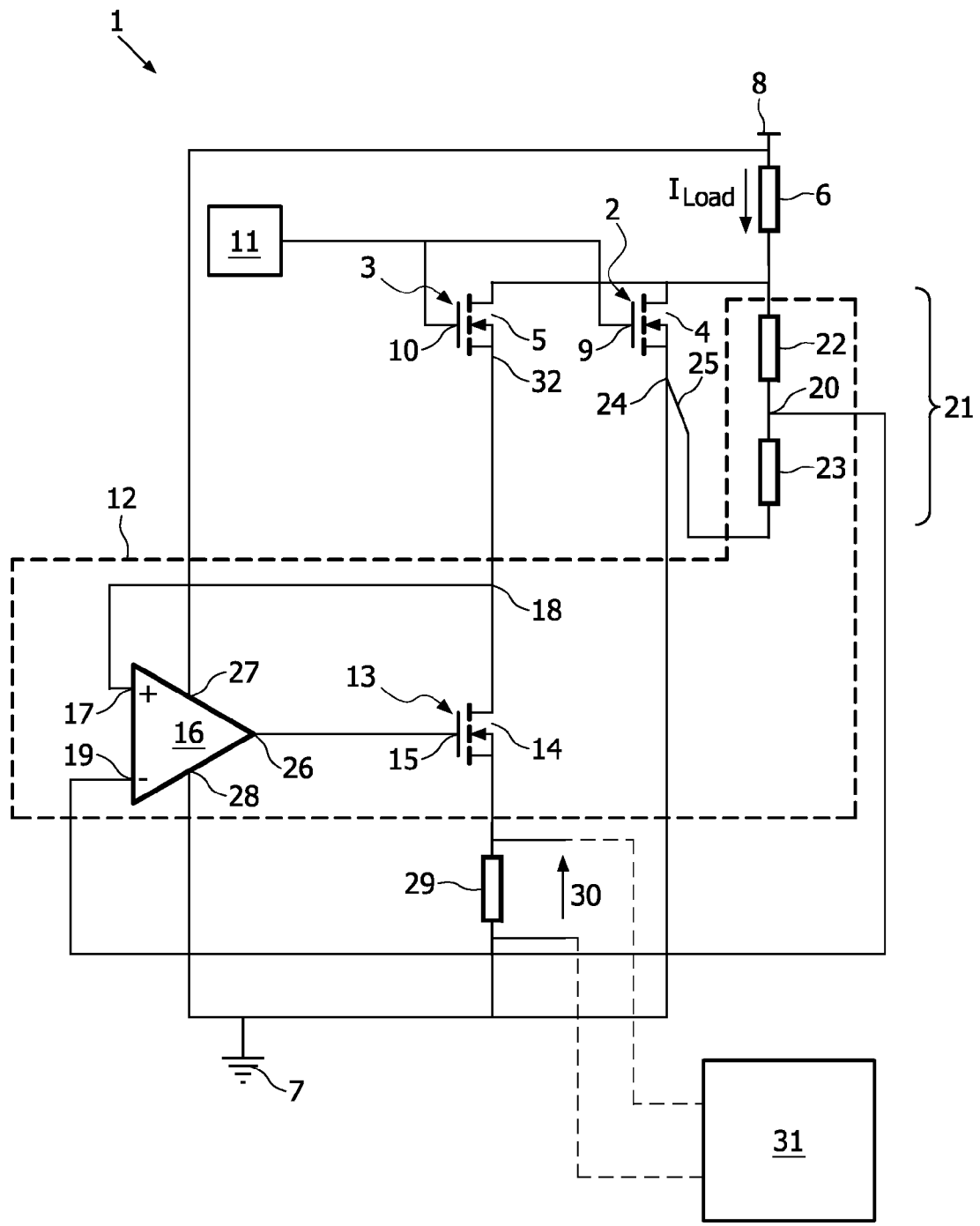

The invention relates to a circuit and method for determining the current in a load. In particular, the invention relates to, but is not limited to, a circuit including a main transistor and a sense transistor operably coupled to a load to enable a voltage dependent on the current in the load to be determined.

In many applications, for instance automotive circuits such as motor, solenoid and lamp drivers, circuitry that can determine the current flowing in a load is often required. For instance, such circuitry may be required to detect current levels that are potentially damaging to electronic components, for example current levels that could cause overheating. Once determined, the current levels can be controlled accordingly.

One method for determining the current in a load is to use a current sensing power metal oxide silicon field effect transistor (MOSFET). Current sensing power MOSFETs conventionally include several thousand transistor cells arranged in parallel and sharing common drain, source and gate electrodes. Each transistor cell or element within the device is identical and current applied at the drain terminal of the device is shared equally between them. In such designs, it is common that the source electrodes of several of the transistors are separated from the remaining source electrodes and connected to a separate source terminal. Accordingly, the resulting current sensing MOSFETs can be thought of as equivalent to two transistors in parallel, these having common gate and drain terminals, but separate source terminals. The first of these transistors, including the majority of the transistor cells in the current sensing power MOSFET, is commonly referred to as the main FET. The second, including the several transistor cells having a separate source terminal, is referred to as the sense FET.

In use, the sense FET conducts only a small fraction of current applied to the common drain terminal, the fraction being inversely proportional to the sense ratio, n, which is a current ratio dependent on the ratio of the number of transistor cells in the main FET to those in the sense FET. The sense ratio is defined for the condition in which the source terminals of the sense and main FETs are held at the same potential. A Kelvin contact to the source terminal of the main FET is generally provided to enable accurate determination of the main FET source potential. When the sense ratio is known, the total current flowing through the device, and therefore the load current of a load to which the device is connected, can be calculated from a measurement of the source current of the sense FET, i.e. the current flowing in the main current path of the sense FET, between the drain and source electrodes.

There are two preferred methods for providing an output voltage proportional to the sense FET source current. A first method is the sense resistor method, in which a sense resistor is connected in the source current path of the sense FET and the voltage across the sense resistor is measured to determine the sense FET current. However, this approach has drawbacks. For instance, inclusion of the sense resistor in this arrangement causes the voltage on the sense FET source to differ from that on the main FET (Kelvin) source. This influences the apparent sense ratio, n, of the current sensing power MOSFET circuit and also introduces temperature dependency to the circuit. These effects can be influenced by the size of the sense resistor, which, in order to minimise errors in measurements, is accordingly limited in such implementations. The amplifier used to determine the sense resistor voltage is generally required to be a true differential amplifier and use of the MOSFET Kelvin source connection is generally required for an accurate indication of the main FET source potential.

A second method for providing an output voltage proportional to the sense FET source current is the virtual earth method. An operational amplifier is arranged in the virtual earth configuration, having its non-inverting input connected to the MOSFET Kelvin source terminal of the main FET (the source terminal also being connected to ground) and its inverting input connected to the source terminal of the sense FET. A sense resistor provides negative feedback from the output of the operational amplifier. This virtual earth arrangement ensures that the source terminal of the sense FET is held at the same potential as the source terminal of the main FET. Accordingly, the sense ratio, n, of the current sensing power MOSFET is not influenced by the sense resistor and a measurement of the sense resistor current that is independent of temperature and is linearly proportional to load current can be achieved.

However, the virtual earth method has drawbacks. For instance, in order to hold the source terminal of the sense FET at the same potential as the source terminal of the main FET, which is normally at the potential of the ground terminal, a voltage that is negative with respect to the sense FET source potential is required for powering the operational amplifier. Use of the MOSFET Kelvin source connection is also generally required for an accurate measurement of the main FET source potential and an additional true differential amplifier can be required to provide a ground referenced output voltage.

The present invention aims to solve at least some of the above problems. In accordance with the invention, there is provided a circuit for determining the current in a load, the circuit comprising first and second transistors, each having a main current path and a control terminal, the main current paths each operably connected in parallel between the load and a common reference point and the control terminals being connected together, and means for setting the voltage across the main current path of the second transistor to a voltage level corresponding to a predetermined portion of the voltage across the main current path of the first transistor.

Setting the voltage across the second transistor, for instance a sense FET of a current sensing power MOSFET, to a value being a predetermined portion of, rather than equal to, the voltage across the first transistor, for instance the main FET of a current sensing power MOSFET, is advantageous over known designs. For instance, the circuit can be configured to operate without a negative power supply, which has clear benefits as regards minimising circuit cost due to complexity and the number of components required.

The circuit may further comprise a sense resistor connected in series with the main current path of the second transistor.

The circuit may further comprise control circuitry for setting the voltage across the main current path of the second transistor, the control circuitry being powered by a single supply voltage that is positive with respect to the common reference point.

The control circuitry can include a control transistor having a main current path connected in series between the main current path of the second transistor and the common reference point. The control circuitry can comprise means for providing a signal for controlling the control transistor, the signal being dependent on the error between the voltage across the main current path of the second transistor and said voltage level.

The signal providing means can comprise a differential amplifier. The differential amplifier may comprise an operational amplifier arrangement.

The differential amplifier can further comprise a first input terminal connected to a node arranged in series between the second transistor and the control transistor and a second input terminal connected to a potential divider arrangement.

The potential divider arrangement can comprise a first resistor and a second resistor connected in series, the potential divider arrangement being connected in parallel to the main current path of the first transistor. The resistances of the first and second resistors can be selected to set the required effective current sense ratio of the circuit, without altering the actual ratio of transistor cells in the main and sense FETs. This enables the sense ratio of the current in the main current path of the main transistor to the current in the main current path of the sense transistor to be optimised for a given application. One or both of the first and second resistors may have adjustable resistances. Accordingly, in this case, the effective sense ratio does not need to be predetermined, but can, for instance, be dynamically set during use of the circuit or during calibration of the circuit prior to use.

A terminal of the second resistor may be connected using a Kelvin contact to a source terminal of the first transistor.

The sense resistor can be connected in series between the main current path of the control transistor and the common reference point and the circuit may comprise means for determining the voltage across the sense resistor. The control transistor can effectively decouple the sense resistor and its associated drawbacks from the sense FET source. Accordingly, a larger sense resistor than might otherwise be possible can be used, thus providing an output voltage requiring little or no amplification and a better signal to noise ratio than the sense resistor method.

The first and second transistors may comprise metal oxide silicon field effect transistors combined in a single semiconductor package. The main current path of the second transistor can have a higher resistance than the main current path of the first transistor. The first transistor can comprise a plurality of transistors arranged in parallel and the second transistor can comprise one or more transistors arranged in parallel.

According to the invention, there is further provided a method for determining the current in a load, the load operably connected in series to a parallel arrangement of first and second transistors, the first and second transistors each having a main current path and a control terminal, the method comprising setting the voltage across the main current path of the second transistor to a voltage level corresponding to a predetermined portion of the voltage across the main current path of the first transistor.

To aid understanding of the invention, embodiments thereof will now be described, purely by way of example, with reference to the accompanying drawing, in which:

FIG. 1 is a schematic illustration of a circuit, according to the invention, for determining the current in a load.

Referring to FIG. 1, the circuit 1 comprises first and second transistors 2, 3, each having a respective main current path 4, 5 connected in parallel between a load resistance 6 and a common reference point, or ground terminal 7. The load resistance 6 is, in turn, connected to a power supply terminal 8. The first transistor 2 is, in the present example, the main metal oxide silicon field effect transistor (MOSFET) of a current sensing power MOSFET and the second transistor 3 is the sense MOSFET of a current sensing power MOSFET, although other transistors or equivalent components can be used. The main transistor control terminal, or gate electrode 9, is connected to the gate electrode 10 of the sense transistor 3. The gate terminals 9, 10 are connected to gate driving circuitry 11.

Control circuitry 12 is provided, this including a control transistor 13, in this example a MOSFET having a main current path 14 and a control terminal 15. The main current path 14 of the control transistor 13 is connected in series between the main current path 5 of the sense transistor 3 and the ground terminal 7. The control circuitry 12 also includes a differential amplifier 16, in this example an operational amplifier, having its non-inverting input 17 connected to a node 18 between the main current paths 5, 14 of the sense and control transistors 3, 13, and its inverting input 19 connected to a node 20 of a potential divider network or arrangement 21. The potential divider arrangement 21 is formed by series combination of a first resistor 22, having a resistance R1, the node 20, and a second resistor 23, having a resistance R2. The potential divider arrangement 21 is connected in parallel across the main current path 4 of the main transistor 2. In particular, in the present example, the second resistor 23 of the potential divider arrangement 21 is connected to the source terminal 24 of the main transistor 2 using a Kelvin contact connection 25. The output 26 of the operational amplifier 16 is connected to the gate electrode 15 of the control transistor 13, the positive supply terminal 27 is connected to the power supply rail 8 and the negative supply terminal 28 is connected to the ground terminal 7.

A sense resistor 29, having a resistance $R_s$, is connected in series between the main current path 14 of the control transistor 13 and the ground terminal 7. The voltage 30 across the sense resistor 29 provides the output $V_{out}$ of the circuit 1, and is referenced, in the present example, to the ground terminal potential. Output circuitry 31 is provided for signal processing of the output voltage $V_{out}$ to determine an indication of the current $I_{load}$ in the load 6.

In use, the gate driving circuitry 11 provides a signal to the gate electrodes 9, 10 of the main and sense transistors 2, 3, to switch the transistors 2, 3 'on'. Current accordingly flows through the respective main current paths 4, 5 of the main and sense transistors 2, 3, as well as through the potential divider arrangement 21. The operational amplifier 16 provides a control signal to the gate electrode 15 of the control transistor 13. The control signal is dependent on the error between the voltage level of the node 18 between the main current paths 5, 14 of the sense and control transistors 3, 13 and the voltage level of the node 20 in the potential divider arrangement 21. The control signal therefore acts to set the voltage level at the node 18 between the sense and control transistors 3, 13, which is also the voltage level at the source terminal 32 of the sense transistor 3, to be substantially equal to the voltage level of the node 20 in the potential divider arrangement 21.

The potential divider arrangement 21 is used to divide the voltage across the main current path 4 of the main transistor 2 into a first voltage portion defined by R1 as a portion of the total potential divider resistance R1+R2 and a second voltage portion defined by R2 as a portion of the total potential divider resistance R1+R2. Therefore, the voltage at the node 20 of the potential divider network 21 corresponds to the predetermined portion R2/(R1+R2) of the voltage across the main current path of the main transistor 2. Setting the sense transistor source terminal 32 to the voltage at the node 20 therefore sets the voltage across the main current path 5 of the sense transistor 3 to correspond to the portion R1/(R1+R2) of the voltage across the main current path 4 of the main transistor 2. This ensures that the sense transistor source current is proportional to the main transistor source current.

The control transistor 13 effectively decouples the sense resistor 29 from the source 32 of the sense transistor 3. The current in the sense resistor 29 is equal to the current in the main current path 5, or source current, of the sense transistor 3, which, as described above, is a predetermined portion of the current in the main transistor 2. This predetermined portion is defined by the sense ratio, n, of the current sensing MOSFET and the ratio of the resistances R1 and R2 of the first and second resistors 22, 23 in the potential divider arrangement 21. Knowing the resistance $R_s$ of the sense resistor 29 and the voltage 30 across the sense resistor 29, the current in the sense resistor 29 can be determined. Based on the voltage 30 across the sense resistor 29, the output circuitry 31 can accordingly determine the current $I_{load}$ in the load resistance 6.

In the present example, the equation by which the current in the main current path 4 of the main transistor 2 can be calculated is:

$$I_{Main} = I_{Sense} \times n \times \frac{(R1 + R2)}{R1},$$

where $I_{Main}$ is the source current of the main transistor 2, $I_{Sense}$ is the source current of the sense transistor 3 and n is the sense ratio, also known as the geometric cell ratio, of the current sensing power MOSFET in which the main transistor 2 and sense transistor 3 are packaged. The ratio between $I_{Main}$ and $I_{sense}$ can accordingly be adjusted by setting the ratio of the resistances R1 and R2 of the first and second resistors 22, 23 in the potential divider network 21. One or both of the first and second resistors 22, 23 can be adjustable resistors or other components having resistances that can be altered such that the ratio between $I_{Main}$ and $I_{Sense}$ does not need to be predetermined, but can, for instance, be dynamically set during use of the circuit or during calibration of the circuit prior to use.

The resistances R1, R2 of the first and second resistors 22 and 23 of the potential divider network 21 are set to be much higher than the resistances of the respective first and second transistor main current paths 4, 5. The current flowing through the potential divider network 21 is therefore much smaller than the source currents of the first and second transistors 2, 3. The error in the determined load current $I_{load}$ contributed by the potential divider network current is therefore insignificant. Furthermore, the temperature coefficient of the potential divider network 21 is also insignificant. In the present example, the resistors 22, 23 are each chosen to be types having low power dissipation and low temperature coefficients of resistance, such that their temperature drift errors are not significant. Furthermore, the first and second resistors 22, 23 are matched, such that any temperature drift that occurs in the first resistor 22 also occurs in the second resistor 23 and therefore the effects of the temperature drift are cancelled out.

Determinations of sense resistor voltage 30, and therefore load current $I_{load}$, according to the present invention, have advantages over previous designs as regards accuracy and linearity. In particular, the output voltage will be independent of variables such as temperature and bias voltage and the circuit 1 does not require the negative power supply used in the virtual earth method.

The specific parameters of components in the circuit 1 will vary according to the application. However, in typical implementations, the main transistor current path 4 has a resistance of between 1 and 100 milliOhms, the sense transistor current path 5 has a resistance of between 1 and 100 Ohms, the first and second resistors 22, 23 in the potential divider chain 21 have resistances of 10 kOhms or more and the load resistance 6 is in the range 100 milliOhms to 10 Ohms.

From reading the present disclosure, other variations and modifications will be apparent to persons skilled in the art. Such variations and modifications may involve equivalent and other features which are already known in the design, manufacture and use of current detecting and/or determining devices and which may be used instead of or in addition to features already described herein.

For instance, whilst the sense and main transistors in the circuit 1 are provided within a current sensing power MOSFET package, other implementations are possible. For example, some or all of the remaining components of the circuit, such as the control transistor 13, operational amplifier 16, sense resistor 29 and potential divider arrangement 21, could be integrated within the MOSFET package. Alternatively, the main and sense MOSFETs 2, 3 can be provided as discrete components and are not limited to being power MOSFETs; other transistor types could be used with appropriate changes to the circuit 1. Furthermore, it is not essential that a Kelvin contact connection 25 is provided at the source electrode 24 of the main transistor 2. Alternatively, such a connection could be omitted and/or used at other electrodes of either of the main and sense transistors 2, 3. Also, the position of the sense resistor 29 in the sense transistor current path is not limited to being between the main current path 14 of the control transistor 13 and the ground terminal 7, other positions in current path of the sense transistor 3 could instead be used.

Whilst the circuit 1 that has been described includes output circuitry 31 for processing the circuit output voltage 30 to derive the current $I_{load}$ in the load resistance 6, such circuitry is not essential. Other implementations may use alternative processing circuitry or none at all as may be required by the application.

There are many and varied applications of the invention. They include automotive circuits, such as motor, solenoid and lamp drivers. In such applications, the circuits and methods of the invention can, for instance, be implemented to detect current levels that are potentially damaging to electronic components, for example current levels that could cause overheating. Once determined, the current levels can be controlled accordingly.

Although claims have been formulated in this application to particular combinations of features, it should be understood that the scope of the disclosure of the present invention also includes any novel features or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A circuit for determining the current in a load, the circuit comprising:

first and second transistors, each having a main current path and a control terminal, the main current paths each operably connected in parallel between the load and a common reference point and the control terminals being connected together; and means for setting the voltage across the main current path of the second transistor to a voltage level corresponding to a predetermined portion of the voltage across the main current path of the first transistor, control circuitry for setting the voltage across the main current path of the second transistor, the control circuitry being powered by a single supply voltage that is positive with respect to the common reference point, wherein the control circuitry includes a control transistor having a main current path connected in series between the main current path of the second transistor and the common reference point, wherein the control circuitry comprises means for providing a signal for controlling the control transistor, the signal being dependent on the error between the voltage across the main current path of the second transistor and said voltage level, and wherein the signal providing means comprises a differential amplifier in an operational amplifier arrangement further including, a first input terminal connected to a node arranged in series between the second transistor and the control transistor; and a second input terminal connected to a potential divider arrangement.

2. A circuit according to claim 1, wherein the potential divider arrangement comprises a first resistor and a second resistor connected in series, the potential divider arrangement being connected in parallel to the main current path of the first transistor.

3. A circuit according to claim 2, wherein one or both of the first and second resistors have adjustable resistances.

4. A circuit according to claim 2, wherein a terminal of the second resistor is connected by a Kelvin contact to a source terminal of the first transistor.

* * * * *